(12) United States Patent
Chen

(10) Patent No.: US 12,176,193 B2
(45) Date of Patent: *Dec. 24, 2024

(54) SYSTEM AND METHOD FOR RESIDUAL GAS ANALYSIS

(71) Applicant: Taiwan Semiconductor Manufacturing Co., Ltd., Hsinchu (TW)

(72) Inventor: Yen-Liang Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/361,767

(22) Filed: Jul. 28, 2023

(65) Prior Publication Data

US 2023/0386807 A1 Nov. 30, 2023

Related U.S. Application Data

(63) Continuation of application No. 16/942,577, filed on Jul. 29, 2020, now Pat. No. 11,791,141.

(51) Int. Cl.
*H01J 37/34* (2006.01)
*B08B 5/00* (2006.01)
*B08B 13/00* (2006.01)
*H01J 37/32* (2006.01)

(52) U.S. Cl.
CPC ............ *H01J 37/3476* (2013.01); *B08B 5/00* (2013.01); *B08B 13/00* (2013.01); *H01J 37/32862* (2013.01); *H01J 37/32981* (2013.01); *B08B 2205/00* (2013.01); *H01J 2237/0225* (2013.01)

(58) Field of Classification Search
CPC ....... B08B 13/00; B08B 2205/00; B08B 5/00; C23C 16/4405; H01J 2237/0225; H01J 37/32862; H01J 37/32981; H01J 37/34; H01J 37/3476
See application file for complete search history.

(56) References Cited

U.S. PATENT DOCUMENTS

| | | | | | |
|---|---|---|---|---|---|
| 5,281,302 | A | * | 1/1994 | Gabric | C23G 5/00 134/1 |
| 6,046,796 | A | * | 4/2000 | Markle | H01J 37/32935 216/60 |
| 6,081,334 | A | * | 6/2000 | Grimbergen | G01B 11/0683 356/369 |

(Continued)

FOREIGN PATENT DOCUMENTS

| | | |
|---|---|---|
| CN | 101452816 B | 6/2010 |
| CN | 101765900 A | 6/2010 |

(Continued)

*Primary Examiner* — Douglas Lee
(74) *Attorney, Agent, or Firm* — Seed IP Law Group

(57) ABSTRACT

The present disclosure provides embodiments of a system and method for detecting processing chamber condition. The embodiments include performing a wafer-less processing step in a processing chamber to determine the condition of the chamber walls. Based on an analysis of the residual gas resulting from the wafer-less processing step, an operator or a process controller can determine whether the chamber walls have deteriorated to such an extent as to be cleaned.

20 Claims, 4 Drawing Sheets

(56) References Cited

U.S. PATENT DOCUMENTS

| | | | |
|---|---|---|---|
| 6,635,996 B1 * | 10/2003 | Nakajima | H01J 37/32577 315/111.21 |
| 7,312,865 B2 * | 12/2007 | Chen | G01N 21/68 356/237.2 |
| 8,309,440 B2 | 11/2012 | Sanchez et al. | |
| 9,330,990 B2 * | 5/2016 | Chen | G06F 17/16 |
| 9,972,478 B2 | 5/2018 | Guha et al. | |
| 11,791,141 B2 * | 10/2023 | Chen | H01J 37/32862 134/1.2 |
| 2004/0235303 A1 * | 11/2004 | Wong | H01J 37/32862 438/689 |
| 2016/0320359 A1 | 11/2016 | Chuang et al. | |
| 2017/0282223 A1 * | 10/2017 | Coppa | H01L 22/12 |
| 2019/0093218 A1 * | 3/2019 | Lay | C23C 16/4405 |

FOREIGN PATENT DOCUMENTS

| | | |
|---|---|---|
| CN | 103167901 B | 8/2015 |
| CN | 104217981 B | 1/2018 |
| CN | 109715848 A | 5/2019 |
| EP | 2034046 B1 | 2/2014 |
| TW | I322449 B | 3/2010 |

* cited by examiner

SYSTEM AND METHOD FOR RESIDUAL GAS ANALYSIS

BACKGROUND

Semiconductor fabrication utilizes a variety of processing steps, including etching and depositing films (i.e., layers) on masked wafers in order to create trenches, vias, metal lines, components of passive and active electrical circuits, such as capacitors, resistors, inductors, transistors, antennas, and in general forming insulating and conducting structures in the production of chips having semiconductor integrated circuits.

One processing step includes plasma etching performed by applying electromagnetic energy, typically radio frequency (RF), to a gas containing a chemically reactive element, such as fluorine or chlorine. The plasma releases positively charged ions that bombard the wafer to remove (etch) materials and chemically reactive free radicals that react with the etched material to form volatile or nonvolatile byproducts. The electric charge of the ions directs them vertically toward the wafer. This produces the almost vertical etch profiles essential for the miniscule features in today's densely packed chip designs. Process chemistries differ depending on the types of films to be etched. Those used in dielectric etch applications are typically fluorine-based. Silicon and metal etch use chlorine-based chemistries. In reactive ion etching, the objective is to optimize the balance between physical and chemical etching such that physical bombardment (etch rate) is enough to remove the requisite material while appropriate chemical reactions occur to form exhausted volatile byproducts.

Other processing steps include non-plasma etching, chemical vapor deposition (CVD) and physical vapor deposition (PVD). These steps, as well as the above-described plasma etching steps, are performed using various precursor gases (i.e., reactive gases and/or reactive gas mixtures, and in some instances, reactive gases and their respective inert carrier gases) provided to a processing chamber that holds the wafers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
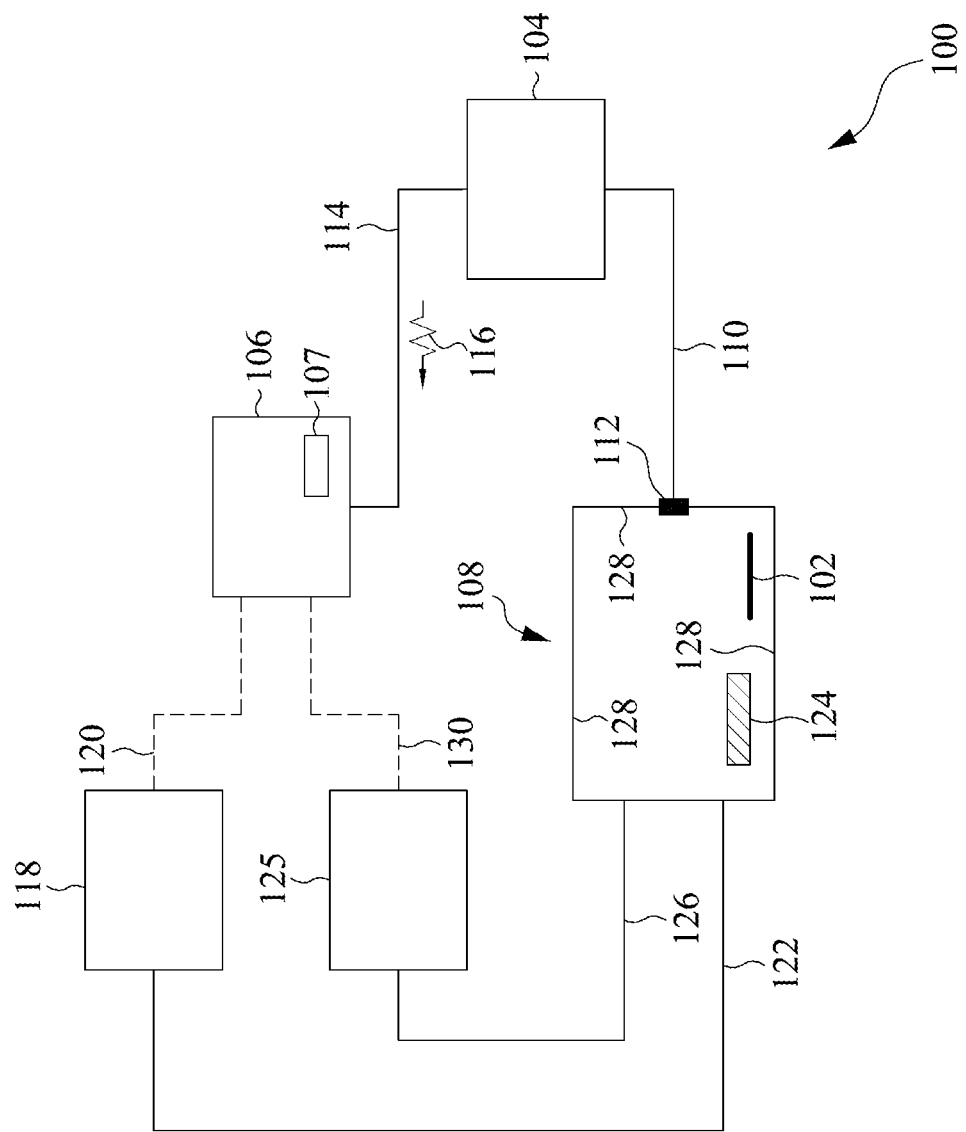
FIG. 1 illustrates a system for detecting processing chamber condition, according to an embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wafers are often processed in batches, called lots. Dependent upon the processing step, the wafers may be processed in a processing chamber. The processing chamber may be temperature and pressured controlled and may include ports for importing precursor (i.e., reactive) gases and exporting byproducts of the processing step, such as any residual gases. The processing chamber may also include electronics for creating a plasma of the gases imported to the chamber as part of a processing step. Processing chambers and associated components are well-known in the art and will not be described in greater detail.

The walls of the processing chamber, being exposed to a variety of byproducts resulting from the reaction of the precursor gases with the wafers or with other material substances in the chamber, for example material substances used in plasma sputtering processes, deteriorate (i.e. decay) over time. In the context of the present disclosure, deterioration of the chamber, and specifically the walls of the chamber, refers to the buildup of byproducts on the chamber walls, thereby reducing the effectiveness of the respective processing steps that produced such byproducts. It would be advantageous to know when the chamber walls need to be cleaned of such contaminants so that future batches of wafers will not have reduced yields and/or the cost of future fabrication steps will not be increased due to, for example, an increase in the amount of precursor gases and/or an increase in processing times needed to overcome the reduced efficiency of the fabrication steps.

FIG. 1 illustrates a system 100 for detecting processing chamber condition, according to an embodiment of the disclosure. The system 100 includes an ion analyzer module 104 and a process controller 106. In one embodiment, one or more wafers 102 may be positioned in a processing chamber 108. The one or more wafers 102 may represent a batch of wafers. In other embodiments of the disclosed system 100, the wafer 102 is not positioned in the processing chamber 108. The processing chamber 108 may be used in conjunction with semiconductor fabrication process steps known to those of skill in the art. For example, the processing chamber may be used in the fabrication of integrated circuits by performing sequences of processing steps, such as deposition of various layers or films via CVD and/or PVD, plasma and non-plasma based etching, ion implantation and annealing, on batches of semiconductor wafers (also referred to semiconductor substrates). The wafers 102 may be formed of any type of substrate material, including semiconductor substrates formed of silicon or gallium arsenide.

In one embodiment, the processing chamber 108 processes one or more batches of wafers, such as the batch of wafers 102. A batch of wafers may undergo a plurality of fabrication processing steps in the processing chamber 108. After processing one or more batches of wafers in the processing chamber 108, an operator may initiate a process to detect the condition of the processing chamber 108 as discussed further below.

In an embodiment, the ion analyzer module 104 is coupled to the processing chamber 108, for example, via a conduit 110 and a port 112 of the processing chamber 108. The ion analyzer module 104 is also communicatively coupled to the process controller 106 via either a physical connection, such as a communication cable 114, or via wireless communication 116. In an alternate embodiment (not shown), the ion analyzer module 104 is positioned in the processing chamber 108, and the ion analyzer module 104 communicates with the process controller 106 in the same manner as previously described (i.e. wireless communication or via a physical connection through the port 112 of the processing chamber 108). In another embodiment (not shown), the processor controller 106 is included as a component of the ion analyzer module 104. In this embodiment, the ion analyzer module 104 includes electronics, such as processors, memory, hard disk, I/O, etc., that perform the functions of the process controller 106, as discussed further below.

In one embodiment, the ion analyzer module 104 is a gas chromatograph configured to analyze gases for ion species. The gases may include one or more ion species, such as fluoride ions, chloride ions and/or bromide ions. For example, the gas chromatograph may be configured to measure the concentration of the ion species in the gases. In another embodiment, the ion analyzer module 104 includes a gas chromatograph and a mass spectrometer for the identification of ion species and the measurement of their respective concentrations. Gas chromatographs and mass spectrometers are well known in the art and will not be discussed in any further detail.

In an embodiment, the ion analyzer module 104 receives a residual gas from the processing chamber 108 either during the processing of a batch of wafers or during one or more wafer-less processing steps. Wafer-less processing steps include any semiconductor processing steps, such as production processing steps used in the processing of batches of wafers being performed in the processing chamber 108 without any wafers in the processing chamber 108. The residual gas may contain one or more ion species, such as fluoride ions, chloride ions and/or bromide ions, but the scope of the disclosure includes ion analyzer modules configured to analyze the residual gas for ion species produced by any semiconductor fabrication processing step.

The process controller 106 is configured to receive (or retrieve) the results of the gas analysis performed by the ion analyzer module 104. The process controller 106 may include electronics 107, such as microcontrollers, memory, hard disk, and/or I/O (i.e., keypads and displays), etc. In one embodiment, the display (an electronic 107) of the process controller 106 displays the results of the ion analyzer module 104 to an operator of the system 100. The results may indicate the concentrations of the various ion species measured by the gas analyzer module 104, and as such, indicate the condition of the processing chamber 108 (i.e., the extent of processing chamber condition decay). For example, the results may indicate, based upon concentrations of one or more (predefined) ion species being greater than one or more (predefined) respective baseline values, that the processing chamber 108 undergo a cleaning process to remove byproducts accumulated through previous processing steps in the processing of one or more batches of wafers. According to one embodiment of the invention, and as discussed further below in conjunction with FIG. 4, the cleaning process cleans (i.e., removes and/or replaces) byproducts from the inner walls of the chamber in preparation for receiving future batches of wafers for future processing.

In an embodiment, the process controller 106 is optionally coupled to a processing gas module 118 via communication link 120. The processing gas module 118 is coupled to the processing chamber 108 via one or more gas conduits 122. The processing gas module 118 provides the processing chamber 108 with one or more precursor gases (i.e., gases that may react with one another, the batches of wafers being processed and/or other material target substances (e.g., sputtering materials) placed in the processing chamber 108, such as material substance 124), as well as any inert carrier gases for assisting the transport of the precursor gases. These reactive precursor gases may be used to etch the wafers 102 and deposit layers of different material compositions on the wafers 102. In one embodiment, the process controller 106 controls the flow of gases, such as precursor and/or inert gases, from the processing gas module 118 to the processing chamber 108. The process controller 106 may control the flow of gases by controlling the release, proportions, flow rates and/or shut-off of the gases from the processing gas module 118.

In another embodiment, the process controller 106 is optionally coupled to a cleaning gas module 125. As discussed in more detail further below, the cleaning gas module 125 provides one or more cleaning gases to the processing chamber 108 via one or more cleaning gas conduits 126 for cleaning the processing chamber 108, such as chamber walls 128. In one embodiment, the process controller 106 controls the flow (i.e., release, proportions, flow rates and/or shut-off) of the cleaning gases from the cleaning gas module 125 to the processing chamber 108 via communication link 130.

In one embodiment, the cleaning gas module 125 includes, or has access to, gases used for cleaning the processing chamber 108, such as $CF_x$, $C_4F_8$, $CO$, $CH_xF_y$, $SF_6$, $C_5F_8$, $O_2$, $N_2$, $HeO_2$, $C_2F_6$, Ar. The gases may also include carbon tetrafluoride, chlorine gases and/or gases such as $CH_4$, $NF_3$ and HBr. The process controller 106 is configured to initiate the cleaning process of the process chamber by controlling the flow of the one or more cleaning gases from the cleaning gas module 125 to the processing chamber 108. In another embodiment, the process controller 106 is configured to control the wafer-less processing step being performed in the processing chamber 108. For example, the process controller 106 may select one or more processing steps, also referred to as a wafer-less processing steps, to be performed in the processing chamber 108. The selection may be based upon the history of fabrication processing steps performed on the batches of wafers in the processing chamber 108. The history may be stored in the memory (an electronic 107). In one embodiment, the selection is based upon the history of fabrication processing steps performed on the batches of wafers in the processing chamber 108 since the last cleaning of the processing chamber 108. In another embodiment, an operator selects, via the process controller 106, or in another embodiment via input controls (not shown) on the cleaning gas module 125, the one or more wafer-less processing steps to be performed in the processing chamber 108.

In another embodiment, the processing gas module 118 includes, or has access to, such fabrication processing gases as nitrogen trifluoride, chlorine, hydrogen bromide, silicon hexafluoride and carbon tetrafluoride, singly or in any combination, although the scope of the present disclosure includes all gases and combination of gases used in fabrication processing steps. In one embodiment, the processing gas module 118 and the cleaning gas module 125 includes (or has access to) separate storage canisters of gas, where each canister contains a single fabrication processing gas.

Figure 2:
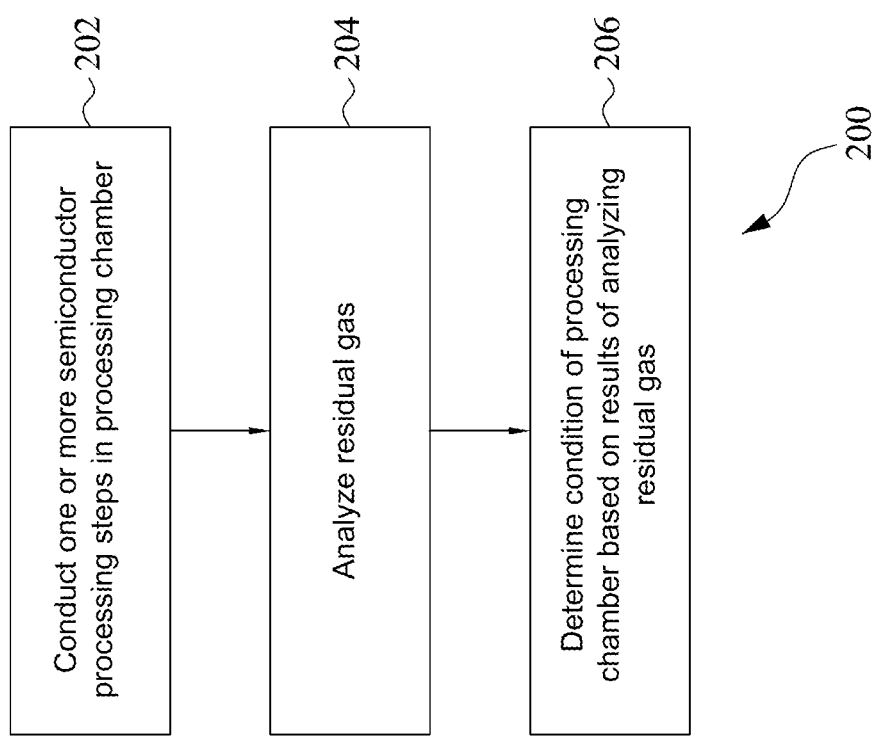
FIG. 2 is a flow chart of a method for detecting processing chamber condition, according to an embodiment of the disclosure.

FIG. 2 is a method flow chart 200 for detecting processing chamber condition, according to an embodiment of the disclosure.

In step 202, one or more semiconductor processing steps are performed in a processing chamber 108. For example, in one embodiment of the disclosure, a process controller 106 may select one or more processing steps (also referred to as wafer-less processing steps) and/or control the flow of one or more gases (e.g., precursor gases and/or inert carrier gases used in the selected processing steps) from the processing gas module 118 to the processing chamber 108. In one embodiment, the wafer-less processing steps may be based on a history of the processing steps of one or more lots (i.e., batches) of wafers. The history may include the number, types and characteristics, such as precursor gases used and operating parameters of the processing chamber 108, of the previous processing steps performed on more or more batches of wafers. In another embodiment, an operator may input instructions to an I/O interface (an electronic 107) of the process controller 106, or alternatively, directly to an I/O interface (not shown) of the processing gas module 118 to select one or more processing steps (i.e., also referred to as wafer-less processing steps) and/or to control the release of one or more precursor gases from the processing gas module 118 to the processing chamber 108 based on the results of the ion analyzer module 104 as communicated to the operator by the display (an electronic 107).

The one or more wafer-less processing steps includes introducing one or more precursor gases into the processing chamber 108. The one or more gases may react with each other, the walls 128 of the processing chamber 108 and/or a target substance (e.g., a sputtering material or the wafer 102) in the processing chamber 108. The chemical reaction of the one or more gases with compounds accumulated on the walls 128 of the processing chamber 108 may result in a residual gas. The compounds may be accumulated as by-products of the fabrication processing steps performed within the processing chamber 108 on one or more batches of wafers 102. In one embodiment, the concentration of one or more ion species in the residual gas indicates the condition of the walls 128 of the processing chamber 108.

Figure 3:
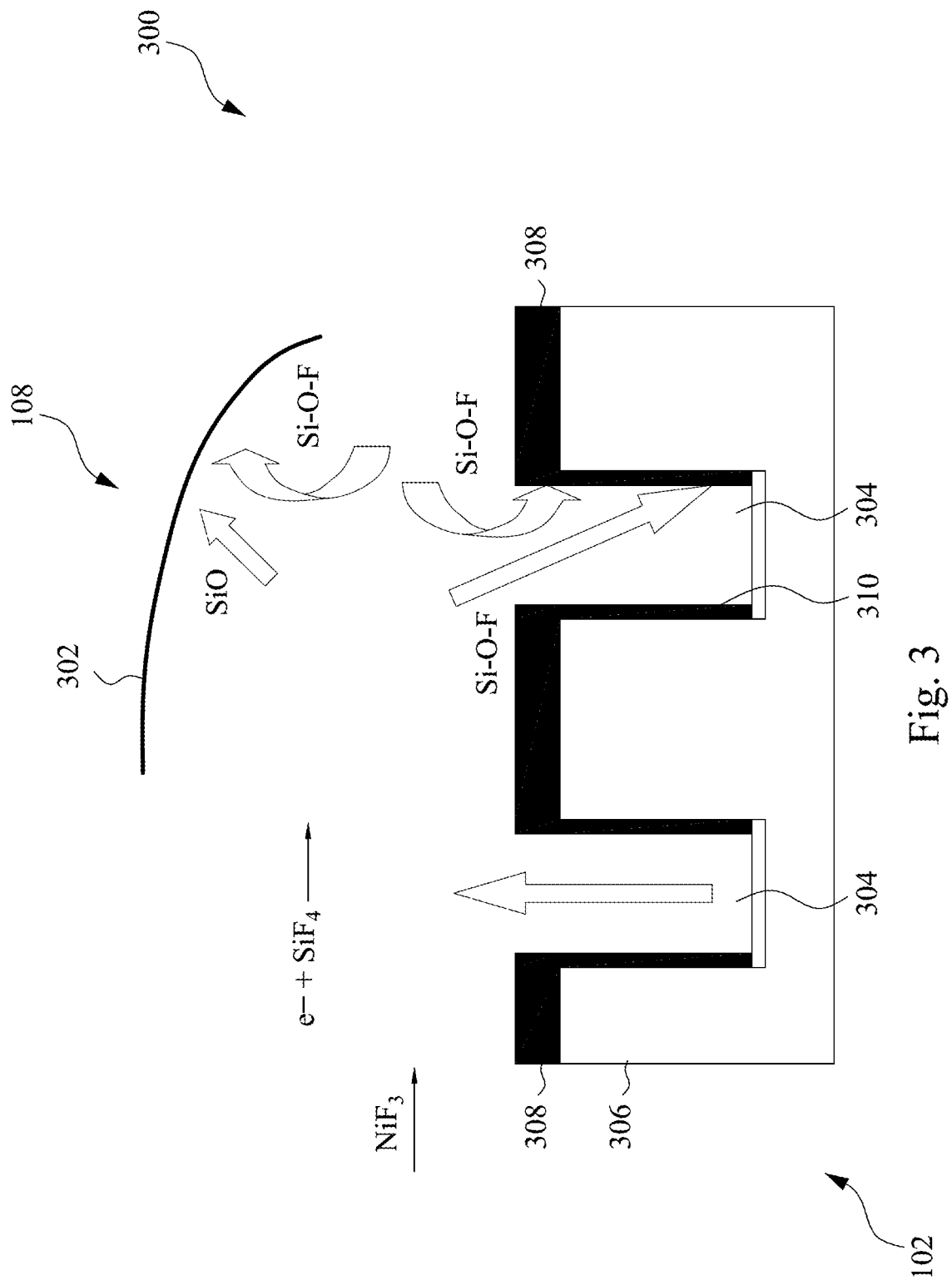
FIG. 3 illustrates a processing step being performed on the control wafer in the processing chamber of FIG. 1, according to an embodiment of the disclosure.

FIG. 3 illustrates a processing step 300 being performed on the wafer 102 in the processing chamber 108, according to an embodiment of the disclosure. The processing step 300 may represent, for example, an etching process, a CVD process, or a PVD process, being performed on the wafer 102 within the processing chamber 108. For ease of illustration, only a small segment 302 of the wall 128 of the processing chamber 108 is shown, however the wall 128 of the processing chamber 108 completely encases the wafer 102. Depending upon the processing step, the processing chamber 108 may be controlled to be at predefined temperatures and/or pressures, and the processing chamber 108 may include electronics, such as electrodes (not shown) for generating a plasma.

In the processing step 300, one or more precursor gases are introduced into the processing chamber 108. For example, if the processing step is a plasma-based dry etching processing step, the precursor gases may include, but are not limited to, nitrogen trifluoride, hydrogen bromide and chlorine, sulfur hexafluoride, chlorine, chlorine and sulfur hexafluoride or carbon tetrafluoride. The principles discussed below apply to other processing steps such as CVD and PVD for depositing layers on the wafer, and non-plasma based dry etching processing steps using, but not limited to, such precursor gases as xenon difluoride, bromine trifluoride, chlorine trifluoride.

For the purposes of illustration only, the processing step 300 is a plasma-based dry etching processing step using nitrogen trifluoride as the precursor processing gas. As illustrated, nitrogen trifluoride is provided to the processing chamber 108 for etching trenches 304 in a silicon dioxide film 306 of the wafer 102. In this embodiment, the wafer 102 has been patterned with a photoresist layer 308. A fluorine plasma is generated using RF power applied to electrodes (not shown) in the processing chamber 108, thereby driving a chemical reaction between the nitrogen trifluoride precursor gas and those portions of the wafer 102 not masked by the photoresist layer 308. The byproduct of the etching process is silicon tetrafluoride on the walls 310 of the trench 304, which is a volatile product. However, the plasma in the processing chamber 108, represented by the electron $e^-$, can cause the silicon tetrafluoride to disassociate into free radicals, and the product of this disassociation in the presence of oxygen $O_2$ can result in a buildup of a layer of silicon oxyfluoride (Si—O—F) compound on the walls 310 of the trench 304 being etched and a buildup of a layer of silicon oxyfluoride, silicon oxide and/or silicon dioxide on the segment 302 of the walls 128 of the processing chamber 108 or on the walls 128 of the processing chamber 108.

During a fabrication (i.e., processing) cycle, processing steps for providing functional chips (i.e., fabricating functional chips) from a batch of wafers are performed on the batch of wafers (e.g., wafers 102) in the processing chamber 108. As the wafers are processed through one or more fabrication cycles in the processing chamber 108, the thickness of the layer of silicon oxyfluoride compound, for example, and/or other compounds, such as silicon oxide compounds, on the walls 128 of the processing chamber 108 increases. When a wafer-less processing step, such as a wafer-less plasma-based dry etching processing step 300, is periodically performed in the processing chamber 108, without (or alternatively with) a batch of wafers in the processing chamber 108, the concentration of fluoride ions in the residual gas in the chamber as a result of the chemical reaction between the precursor etching gases and the compounds accumulated on the walls 128 of the processing chamber 108 will be larger when the thickness of the layer of silicon oxyfluoride compound on the walls 128 of the processing chamber 108 is larger, due to more fluorine being available for an oxidation/disassociation plasma-driven process and/or for a bond breaking plasma-driven process in which high energy plasma charged species breaks the bonds of fluorine atoms to other compounds accumulated on the walls 128. Thus, the measurement of the concentration of fluorine ions in the residual gas is directly correlated to the thickness of the residual compounds accumulated on the walls 128 of the processing chamber 108. That is, a higher concentration of fluorine ions in the residual gas indicate a thicker layer of residual compounds accumulated on the walls 128 of the processing chamber 108.

Referring again to FIG. 2, in step 204 the residual gas is analyzed for ion species. For example, in one embodiment, the ion analyzer module 104 determines the one or more ion species present in the residual gas, including their respective concentrations.

In step 206, a condition of the processing chamber 108 is determined based on the analysis of step 204. In one embodiment, the analysis is performed by the ion analyzer module 104, however in another embodiment, the analysis is performed by the process controller 106 based upon data received from the ion analyzer module 104. In yet another embodiment, if the analysis indicates that a concentration of one or more ion species is greater than one or more respective (predetermined) baseline values, then the process controller 106 determines that the processing chamber 108 requires a cleaning to remove the layers of processing step byproducts (i.e., residual compounds) accumulated on the walls 128 of the processing chamber 108. In another embodiment, the indication of a mere presence of a predetermined ion species in the residual gas indicates the processing chamber 108 be cleaned to remove the layers of processing step byproducts accumulated on the walls 128 of the processing chamber 108.

In one embodiment, the process controller 106, upon determining that the process chamber 108 requires a cleaning, automatically controls the flow of cleaning gases from the cleaning gas module 125 to the processing chamber 108 for cleaning the chamber walls 128. In another embodiment, the process controller 106 includes a display (or an external computer or other processing device includes a display, or an external display is communicatively coupled to the system 100) for displaying the results of the analysis to an operator. In this embodiment, the operator determines whether to clean the processing chamber 108 based on the results, and the process controller 106 includes an I/O interface (an electronic 107) for use by the operator to input instructions to the process controller 106 for controlling the flow of cleaning gases for cleaning the processing chamber 108. In another embodiment, if the processing step of step 202 is not a wafer-less processing step, but is performed while a batch of wafers 102 are in the processing chamber 108, then the process controller is configured to automatically control the flow of precursor gases from the processing gas module 118 to the processing chamber 108, for example by shutting off the flow, and control the flow of cleaning gases from the cleaning gas module 125 to the processing chamber 108 for cleaning the chamber walls 128.

Figure 4:
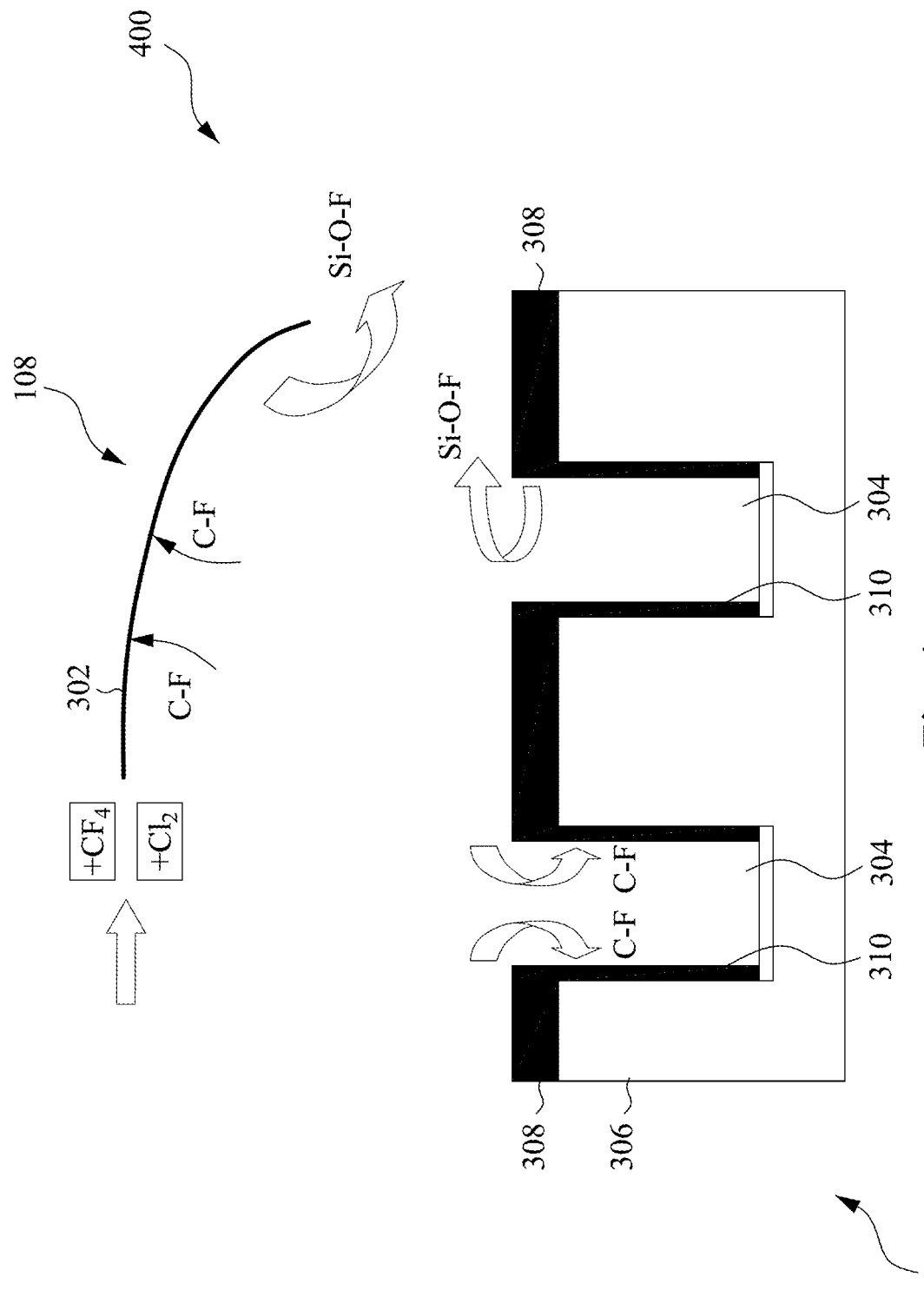
FIG. 4 illustrates a cleaning process being performed on the control wafer in the processing chamber of FIG. 1, according to an embodiment of the disclosure.

FIG. 4 illustrates a cleaning process 400 being performed in the processing chamber 108, according to an embodiment of the disclosure. In one embodiment of the cleaning process 400, one or more cleaning gases are introduced into the processing chamber 108. For purposes of only providing an illustrative embodiment, the following discussion depicts a carbon tetrafluoride-based cleaning process, in which carbon tetrafluoride and chlorine gas are introduced into the chamber. However, the scope of the disclosure covers other cleaning gases or mixtures of cleaning gases for removing and/or replacing byproducts of fabrication processing steps, such as the byproducts from etching, CVD and PVD, from the walls 128 of the processing chamber 108. Although for ease of illustration a wafer 102 is also shown within the processing chamber 108, in one embodiment of the present disclosure the cleaning process 400 is performed on the processing chamber 108 without any wafers present in the processing chamber 108.

When RF power is applied to electrodes (not shown) in the processing chamber 108, a fluorine plasma is generated, thereby driving a chemical reaction, in the presence of oxygen, between the cleaning gases and the compounds accumulated on the segment 302 of the wall 128 (or on the walls 128) of the processing chamber 108, such as silicon oxide and/or silicon dioxide (i.e., the silicon oxide compounds). The chemical reaction results in replacing the silicon oxide compounds, also referred to as a silicon oxide-based passivation film, on the walls 128 of the processing chamber 108 with a carbon rich layer (C—F), resulting in the production of a volatile silicon oxyfluoride gas (Si—O—F), which can be removed from the processing chamber 108.

In some embodiments, the system 100 may employ artificial intelligence or machine learning techniques that may estimate (e.g., predict), either before a next fabrication processing step or during a fabrication processing step, whether the concentration of one or more ion species of the residual gas is greater than one or more respective baseline values, based upon, for example, residual gas analysis history, fabrication processing history, processing chamber cleaning history, and/or likely future fabrication processing steps. The likely future fabrication processing steps may be based upon fabrication processing steps as preprogrammed by an operator of the system 100 and stored in memory and/or based upon fabrication processing history.

The one or more artificial intelligence or machine learning techniques in some embodiments may be implemented at least in part by machine learning circuitry. In one embodiment, the electronics of the process controller 106 may include machine learning circuitry that implement one or more artificial intelligence or machine learning techniques.

"Artificial intelligence" is used herein to broadly describe any computationally intelligent systems and methods that can learn knowledge, based upon data history and/or training data, for example, and use such learned knowledge to adapt its approaches for solving one or more problems, for example, by making inferences on the condition of the processing chamber 108, based on received inputs, such as gas analysis (e.g., data corresponding to the measured residual gases) received in real time from the ion analyzer module 104 and/or gas analysis history, fabrication processing history, processing chamber cleaning history, and/or likely future fabrication processing steps retrieved from memory of the process controller 106.

Machine learning generally refers to a sub-field or category of artificial intelligence, and is used herein to broadly describe any algorithms, mathematical models, statistical models, or the like that are implemented in one or more computer systems or circuitry, such as circuitry of the process controller 106, and which build one or more models based on sample data (or training data) in order to make predictions or decisions.

The machine learning circuitry of the process controller 106 may employ, for example, neural network, deep learning, convolutional neural network, Bayesian program learning, support vector machines, computer vision, and pattern recognition techniques to solve problems such as predicting or determining the condition of the processing chamber 108. Further, the machine learning circuitry may implement any one or combination of the following computational algorithms or techniques: classification, regression, supervised learning, unsupervised learning, feature learning, clustering, decision trees, image recognition, or the like.

As one example, an artificial neural network may be utilized by the machine learning circuitry to develop, train, or update one or more machine learning models which may be utilized to detect or determine the condition of the processing chamber 108. An example artificial neural network may include a plurality of interconnected "neurons" which exchange information between each other. The connections have numeric weights that can be tuned based on experience, and thus neural networks are adaptive to inputs and are capable of learning. The "neurons" may be included in a plurality of separate layers which are connected to one another, such as an input layer, a hidden layer, and an output layer. The neural network may be trained by providing training data (e.g., past data that are indicative of the condition of the processing chamber 108) to the input layer. Through training, the neural network may generate and/or modify the hidden layer, which represents weighted connections mapping the training data provided at the input layer to known output information at the output layer (e.g., gas analysis data). Relationships between neurons of the input layer, hidden layer, and output layer, formed through the training process and which may include weight connection relationships, may be stored, for example, as one or more machine learning models within or otherwise accessible to the machine learning circuitry.

The machine learning circuitry may be implemented in one or more processors having access to instructions, which may be stored in any computer-readable storage medium, which may be executed by the machine learning circuitry to perform any of the operations or functions described herein.

The present disclosure provides a system and method for detecting processing chamber condition without jeopardizing productions of batches of wafers fabricated in the processing chamber. On a periodic basis, either determined by an operator of the system or by, for example, reduction of yields in batches of wafers processed in the processing chamber, or by using the ion analyzer module to collect and analyze residual gases generated during the processing of batches of wafers, a wafer-less processing step is performed in the processing chamber 108 to determine the condition of the chamber walls 128. Based on an analysis of the residual gas resulting from the wafer-less processing step, an operator or a process controller can determine whether the chamber walls 128 have deteriorated to such an extent as to be cleaned. By using the ion analyzer module and the above-described embodiments of the present disclosure to determine when the chamber walls should be cleaned, the stability of yields of future batches of wafers, as well as the cost of future chamber processing steps, may be maintained.

In one embodiment, a method for detecting processing chamber condition includes performing a wafer-less processing step in a processing chamber. The wafer-less processing step includes introducing one or more precursor gases into the processing chamber. The one or more precursor gases react with each other and residual compounds accumulated on the walls of the processing chamber, resulting in a residual gas. The method further includes analyzing the residual gas for ion species and determining a condition of the processing chamber based on the analysis.

In another embodiment, a system for detecting processing chamber condition includes an ion analyzer module configured to be coupled to a processing chamber. The ion analyzer module is further configured to receive a residual gas from the processing chamber as a result of a wafer-less processing step being performed in the processing chamber. The wafer-less processing step includes introducing one or more precursor gases into the processing chamber. The one or more precursor gases react with each other and residual compounds accumulated on the walls of the processing chamber, resulting in the residual gas. The ion analyzer module further analyzes the residual gas for ion species. The system further includes a process controller configured to determine a condition of the processing chamber based on the analysis.

In yet another embodiment, a computer-readable medium includes instructions executable by a processor for detecting processing chamber condition by performing the step of performing a wafer-less processing step in a processing chamber. The wafer-less processing step includes introducing one or more precursor gases into the processing chamber. The one or more precursor gases react with each other and residual compounds accumulated on the walls of the processing chamber, resulting in a residual gas. The computer-readable medium includes further instructions executable by the processor for detecting processing chamber condition by performing the steps of analyzing the residual gas for ion species and determining a condition of the processing chamber based on the analysis.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

For example, in one embodiment of the present disclosure, a computer-readable medium comprises instructions executable by a processor for detecting processing chamber condition by performing steps of controlling a semiconductor processing step in a processing chamber, in which the processing step results in the generation of a residual gas in the chamber, analyzing the residual gas for ionic species, and determining a condition of the processing chamber based on the analysis. The semiconductor processing step includes introducing one or more gases into the processing chamber. The one or more gases react with each other and residual compounds accumulated on the walls of the processing chamber, thereby generating the residual gas.

Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for detecting a processing chamber condition, comprising:
performing an etch processing step on a substrate wafer in the processing chamber in the presence of a first precursor gas;
performing a wafer-less processing step in the processing chamber wherein the wafer-less processing step includes:
introducing a second precursor gas into the processing chamber;
reacting the second precursor gas with a residual compound accumulated on a wall of the processing chamber, the residual compound accumulated on the wall of the processing chamber containing silicon and oxygen; and
producing a residual gas through the reaction of the second precursor gas with the residual compound accumulated on the wall of the processing chamber;
receiving the residual gas at an ion analyzer;
analyzing, by the ion analyzer, the residual gas for ion species;

identifying ion species in the residual gas;
measuring concentration of ion species in the residual gas;
determining a condition of the processing chamber based on the identifying and the measuring;
responsive to the determining, introducing a cleaning gas containing one or more of $CF_x$, $C_4F_8$, CO, $CH_xF_y$, $C_5F_8$ and $C_3F_6$ gas into the processing chamber; and
reacting the cleaning gas with the residual compound accumulated on the wall of the processing chamber.

2. The method of claim 1, wherein the wafer-less processing step includes carrying out an etching processing step, a chemical vapor deposition processing step or a physical vapor deposition processing step in the processing chamber in the absence of a wafer.

3. The method of claim 1, wherein the wafer-less processing step includes contacting the second precursor gas with a target substance in the processing chamber, wherein the target substance is a solid material, and wherein the wafer-less processing step is a plasma sputtering processing step.

4. The method of claim 1, wherein the ion species include a fluoride ion.

5. The method of claim 1, wherein the condition of the processing chamber is based on whether the residual gas has a concentration of one or more ion species of the ion species being greater than one or more respective baseline values.

6. The method of claim 5, wherein the introducing a cleaning gas into the processing chamber includes determining the concentration of the one or more ion species is greater than the one or more respective baseline values.

7. The method of claim 6, wherein the reacting the cleaning gas with the residual compound accumulated on the wall of the processing chamber results in the residual compound being replaced with a carbon-rich compound.

8. The method of claim 1, further comprising performing a plurality of etching steps in the processing chamber on one or more batches of wafers using the first precursor gas, wherein the plurality of etching steps are performed prior to introducing the second precursor gas into the processing chamber of the wafer-less processing step, analyzing the residual gas for ion species, and determining the condition of the processing chamber.

9. The method of claim 8, wherein each the first precursor gas and the second precursor gas includes one or more of nitrogen trifluoride, hydrogen bromide and chlorine, sulfur hexafluoride, chlorine, chlorine and sulfur hexafluoride and carbon tetrafluoride.

10. The method of claim 1, wherein the performing a wafer-less processing step, analyzing the residual gas and determining a condition of the processing chamber are carried out on a periodic basis.

11. A non-transitory computer-readable medium comprising instructions executable by a processor for detecting a processing chamber condition and cleaning the processing chamber by performing the steps of:
performing an etch processing step on a substrate in the processing chamber in the presence of afirst precursor gas containing one or more of nitrogen trifluoride, chlorine, hydrogen bromide, silicon hexafluoride and carbon tetrafluoride gas;
performing a wafer-less processing step in the processing chamber, wherein the wafer-less processing step includes:
introducing asecond precursor gas into the processing chamber;
reacting the second precursor gas with a residual compound accumulated on a wall of the processing chamber, the residual compound accumulated on the wall of the processing chamber containing silicon and oxygen; and
producing a residual gas through the reaction of the second precursor gas with the residual compound accumulated on the wall of the processing chamber, the reaction of the second precursor gas with the residual compound also resulting in a residual gas;
receiving the residual gas at an ion analyzer;
analyzing the residual gas for ion species;
identifying ion species in the residual gas;
measuring concentration of ion species in the residual gas;
determining a condition of the processing chamber based on the identifying and the measuring;
responsive to the determining, introducing a cleaning gas into the processing chamber;
reacting the cleaning gas with the residual compound accumulated on the wall of the processing chamber; and
replacing the residual compound accumulated on the wall of the processing chamber with a carbon-rich layer through reaction in the cleaning gas with the residual compound accumulated on the wall of the processing chamber.

12. The non-transitory computer readable medium of claim 11, wherein the wafer-less processing step further includes reacting the second precursor gas containing one or more of nitrogen trifluoride, chlorine, hydrogen bromide, silicon hexafluoride and carbon tetrafluoride with a solid material target substance in the processing chamber.

13. The non-transitory computer readable medium of claim 11 wherein the wafer-less processing step includes reacting a nitrogen trifluoride second precursor gas with a solid material target substance in the processing chamber.

14. The non-transitory computer readable medium of claim 11 further comprising instructions executable by the processor for performing the step of:
processing one or more batches of wafers within the processing chamber.

15. A method for operating a processing chamber comprising:
performing a silicon containing layer etch processing step in the processing chamber in the presence of a wafer including the silicon containing layer and a nitrogen trifluoride precursor gas;
removing the wafer from the processing chamber;
performing a wafer-less processing step in the processing chamber, wherein the wafer-less processing step includes:
introducing a precursor gas containing carbon tetrafluoride gas and chlorine gas into the processing chamber;
reacting the precursor gas containing the carbon tetrafluoride and the chlorine gas with a residual silicon oxide compound accumulated on a wall of the processing chamber, the reaction of the precursor gas with the residual silicon oxide compound accumulated on the wall of the processing chamber producing a residual Si—O—F gas;
analyzing the residual Si—O—F gas for ion species;
identifying ion species in the residual Si—O—F gas;
measuring concentration of ion species in the residual Si—O—F gas;
determining a condition of the processing chamber based on the identifying and the measuring;
introducing a cleaning gas into the processing chamber;

reacting the cleaning gas with the residual compound accumulated on the wall of the processing chamber; and replacing the residual compound accumulated on the wall of the processing chamber with a carbon-rich layer through reaction in the cleaning gas with the residual compound accumulated on the wall of the processing chamber.

16. The method of claim 15, wherein the performing a silicon containing layer etch processing step in the processing chamber in the presence of a wafer including the silicon.

17. The method of claim 15, wherein the introducing a cleaning gas into the processing chamber includes determining the concentration of the one or more ion species is greater than the one or more respective baseline values.

18. The method of claim 15, further comprising subsequent to completing the wafer-less processing step, performing a processing step on another wafer in the processing chamber.

19. The method of claim 15, wherein the ion species include a fluorine ion.

20. The method of claim 15, wherein the performing a wafer-less processing step, analyzing the residual gas, determining a condition of the processing chamber and introducing the cleaning gas into the processing chamber are carried out on a periodic basis.

\* \* \* \* \*